United States Patent [19]
MacLeish et al.

[11] Patent Number: 5,968,279
[45] Date of Patent: Oct. 19, 1999

[54] METHOD OF CLEANING WAFER SUBSTRATES

[75] Inventors: Joseph H. MacLeish, San Ramon; Mahesh K. Sanganeria, Sunnyvale, both of Calif.

[73] Assignee: Mattson Technology, Inc., Fremont, Calif.

[21] Appl. No.: 08/874,851

[22] Filed: Jun. 13, 1997

[51] Int. Cl.[6] .............................. B44C 1/22; H01L 21/00
[52] U.S. Cl. ...................... 134/1.2; 134/1.3; 156/345; 216/67; 216/79; 438/719
[58] Field of Search .................... 216/67, 2, 79; 438/710, 719; 134/1.2, 1.3; 117/97; 156/345 P

[56] References Cited

U.S. PATENT DOCUMENTS

| | | | |
|---|---|---|---|
| 4,985,372 | 1/1991 | Narita | 438/723 X |
| 5,228,950 | 7/1993 | Webb et al. | 438/720 X |
| 5,413,670 | 5/1995 | Langen et al. | 438/723 X |

*Primary Examiner*—William Powell
*Attorney, Agent, or Firm*—Skjerven, Morrill, MacPherson, Franklin & Friel LLP; Tom Chen

[57] ABSTRACT

The silicon surface of a wafer is cleaned at room temperature in a separate pre-clean chamber prior to epitaxial deposition. Fluorine atoms generated, for example, from $NF_3$ gas, enter the pre-clean chamber, contact the silicon surface, and etch away native oxide, contaminated silicon, and other damage incurred from prior wafer processes. The cleaned wafer is then transferred in an oxygen-free environment to a deposition chamber, for epitaxial deposition. By cleaning at reduced temperatures, autodoping, slip, and other stress-related problems are alleviated. By using a separate chamber for cleaning, system throughput is increased when compared to prior systems using conventional cleaning methods.

13 Claims, 7 Drawing Sheets

METHOD OF CLEANING WAFER SUBSTRATES

BACKGROUND OF THE INVENTION

1. Field of the Invention

This invention relates generally to methods for cleaning and etching silicon surfaces, and more particularly to using $NF_3$ to pre-clean wafers at low temperatures.

2. Description of Related Art

During fabrication of semiconductor devices using silicon wafers, contaminants and impurities may form on the silicon surface of the wafer prior to various processing steps such as epitaxial silicon deposition or oxide layer growth. After removing the contaminants, if the wafer is exposed to oxygen, silicon atoms on the wafer surface immediately bond with the oxygen to form a thin $SiO_2$ film (up to approximately 20 Å) on the wafer surface. This native oxide, $SiO_2$, may interfere with the deposition process, e.g., a polycrystalline film may form when epitaxial film deposition is desired, resulting, for example, in device noise or degraded performance. In addition, native oxide decreases the yield of production of semiconductor devices. The formation of native oxide and the presence of various contaminants on the silicon surface become increasingly serious problems as device geometries become smaller. Such native oxides degrade control and reproducability during the semiconductor device fabrication processes.

Therefore, the native oxide film and contaminants must be removed before deposition and growth of certain films during fabrication of the semiconductor device so that the silicon surface of the wafer is free of oxides and contaminants prior to epitaxial deposition. Conventional cleaning methods use the process chamber of a chemical vapor deposition (CVD) reactor for both cleaning the native oxide off the wafer and for wafer processing, i.e., the deposition of films onto the wafer.

One method, called a hydrogen bake, uses hydrogen to reduce the native oxide from the silicon layer. For a hydrogen bake, the wafer is brought to a high temperature, such as, for instance 1150° C. Hydrogen gas is pumped into the chamber, which reacts with the wafer surface to reduce the native oxide from the silicon, thereby removing the native oxide. The chamber and/or wafer are then cooled to a temperature for silicon deposition.

Another cleaning method uses an HCl etch, oftentimes in conjunction with a hydrogen bake. In this method, the wafer is brought to temperature (i.e., 1150° C. or more) in the reaction chamber. A conventional HCl etch (e.g., 1–5% HCl in $H_2$) is then performed to remove damaged silicon and metal contamination from the wafer surface caused by prior processes, such as wafer polishing. As a result, both native oxide and damage from the silicon surface are removed. The temperature of the wafer is then lowered for epitaxial deposition or oxide growth.

These cleaning techniques require the wafer to be brought to a high temperature in the epitaxial deposition process chamber. This temperature is higher than what is usually required for epitaxial deposition. At high temperatures, the strength of silicon wafers decreases, causing defects such as slip, which can lead to increased yield loss.

Bringing the wafer to a high temperature within the process chamber may also result in undesirable autodoping. The wafer generally includes a semiconductor substrate, typically silicon, in which are formed n-type and p-type regions and on which are formed insulating and conductive layers. In the semiconductor fabrication process, heavily-doped portions in the substrate are often covered with a lightly-doped epitaxial layer in order to achieve a sharp junction between the heavily-doped substrate and the lightly-doped epitaxial layer. However, as the wafer temperature rises to the cleaning temperature, dopants from heavily doped regions evaporate and deposit on the chamber walls and on other parts of the wafer. After the wafer is cleaned, a lightly-doped epitaxial layer is deposited on the wafer. During this deposition, dopants on the chamber wall may dislodge and contaminate the epitaxial layer, resulting in unwanted and unpredictable changes in the dopant concentration in the epitaxial layer.

A further disadvantage with conventional cleaning methods using the process chamber is that throughput of the system is reduced due to the time taken to clean the wafer. Because cleaning and epitaxial deposition are both done in the process chamber, these processes must be performed sequentially. Throughput can be increased by adding more process chambers to the system. However, because process chambers are expensive, increasing throughput using more process chambers increases the cost of the system.

Accordingly, a method of cleaning a silicon surface is desired which overcomes the above-described deficiencies.

SUMMARY

The silicon surface of a wafer is cleaned using a fluorine-containing feed gas (preferably $NF_3$) to generate fluorine atoms, which react with the native oxide and silicon within a separate pre-clean chamber at a reduced temperature.

A wafer to be processed is first cleaned in a separate pre-clean chamber. $NF_3$ gas is used to generate fluorine atoms, which enter the pre-clean chamber. Once the fluorine atoms contact the wafer's silicon surface, native oxides, contaminated silicon, and other damage from prior processes are removed. During the cleaning process, the wafer and pre-clean chamber may be kept at room temperature, or their temperatures may be raised for smoother surfaces and higher etch rates. The native oxide and contaminated silicon on the surface of the wafer is thus removed in the pre-clean chamber. After cleaning, the wafers are then transferred from the pre-clean chamber to a process chamber for epitaxial deposition. In some embodiments, the pre-clean chamber can be configured to provide wafers to two or more process chambers.

By performing pre-cleaning at temperatures substantially lower than the process temperature or the temperatures used in prior cleaning methods, the method in accordance with the present invention reduces autodoping, slip, and other stress problems associated with high temperatures. Furthermore, the use of a separate pre-clean chamber is in sharp contrast to conventional techniques in which the process chamber of the CVD reactor is used for both cleaning the native oxide off the wafer and for wafer processing, i.e., the deposition of films onto the wafer. By providing a separate pre-clean chamber, throughput may be increased since the process chamber does not have to double as a cleaning chamber and may thus be continuously employed for processing wafers. The pre-clean chamber and processing chamber may now also be optimized to solely clean and process wafers, respectively.

BRIEF DESCRIPTION OF THE DRAWINGS

Use of similar reference numbers indicate like or similar elements.

DETAILED DESCRIPTION OF THE PREFERRED EMBODIMENTS

The present invention provides a method and a structure for cleaning the silicon surface of a wafer at a reduced temperature prior to epitaxial deposition by placing the wafer in a separate pre-clean chamber and using $NF_3$ gas. The ability to clean the wafer at a reduced temperature reduces slip and autodoping problems associated with high temperature cleaning processes. In addition, by cleaning the wafer in a separate pre-clean chamber, throughput can be increased at minimal costs to the system because cleaning and epi deposition may now be performed in parallel and because pre-clean chambers are much less expensive than process chambers.

Figure 1:
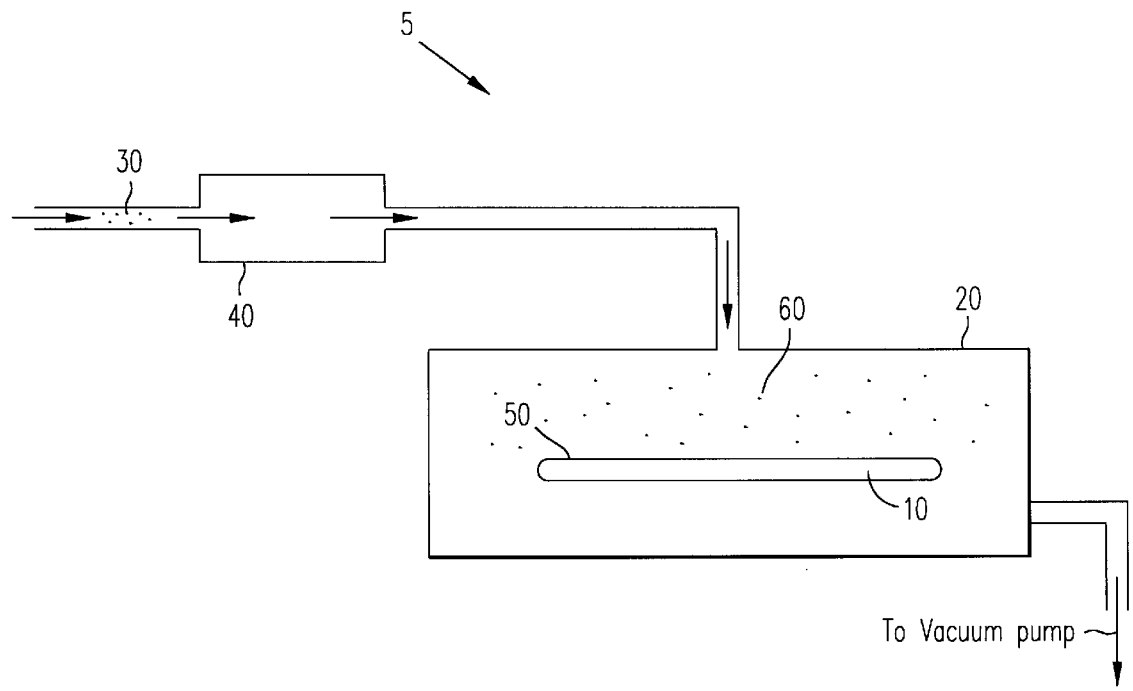
FIG. 1 is a diagram of a cleaning system of the present invention.

FIG. 1 shows a pre-cleaning system 5 of the present invention. A wafer 10 to be processed is inserted into a pre-clean chamber 20. Wafer 10 and pre-clean chamber 20 may be kept at room temperature for the cleaning process or their temperature may be increased if a smoother surface and higher etch rate are desired. Nitrogen trifluoride ($NF_3$) is mixed with a suitable diluent, such as argon, nitrogen or helium, to form a gas 30, which passes through a device 40 to create fluorine atoms 50. Device 40 may be a plasma generator to create an $NF_3$ plasma or a heating source, such as a thermal chamber, to heat the $NF_3$ to decompose the $NF_3$ molecules. Active fluorine atoms 50 enter pre-clean chamber 20, where they contact a silicon surface 60 of wafer 10 to attack the silicon and oxide, thereby etching and cleaning wafer surface 60 of native oxides, contaminated silicon, and other damage incurred from prior processes. These impurities and remaining gases can then be pumped out of pre-clean chamber 20 via a vacuum pump (not shown) connected to pre-clean chamber 20. The cleaned wafer may now be transferred to a process chamber 80 (shown in FIG. 4) for epitaxial deposition.

$NF_3$ is used as a feed gas to generate fluorine atoms. The $NF_3$ gas is diluted with argon or other diluents, where the flow of $NF_3$ is in the range of approximately 2–30 sccm and the flow of argon is in the range of 20–200 sccm. The $NF_3$ gas is then used to generate fluorine atoms using suitable methods, such as using an $NF_3$ plasma or using high temperatures to disassociate $NF_3$ molecules. $NF_3$ plasma can be created by passing the gas through an RF field created by a plasma generator. The fluorine atoms, contained in the plasma, etch the silicon when they contact the silicon surface of the wafer. Fluorine atoms can also be generated by heating the $NF_3$ gas to a high temperature such as 600° C. or higher, which causes the $NF_3$ molecules to decompose into fluorine atoms and other nitrogen-fluorine compounds. The wafer surface is then etched as the fluorine atoms come in contact with the silicon surface.

The etch rate and etch rate uniformity are largely dependent upon three system parameters: pressure, power, and $NF_3$ flow rate. The pressure and power can range from approximately 0.1–10 torr and 100–500 watts, respectively. FIGS. 2A–2C and 3A–3C show results of tests using the method of the present invention with parameter values given in the table below.

| pressure | 0.4–1.2 torr |
| power | 100–300 W |
| flow rate | |
| $NF_3$ | 10–20 sccm |
| Ar | 70 sccm |

Figure 2A:
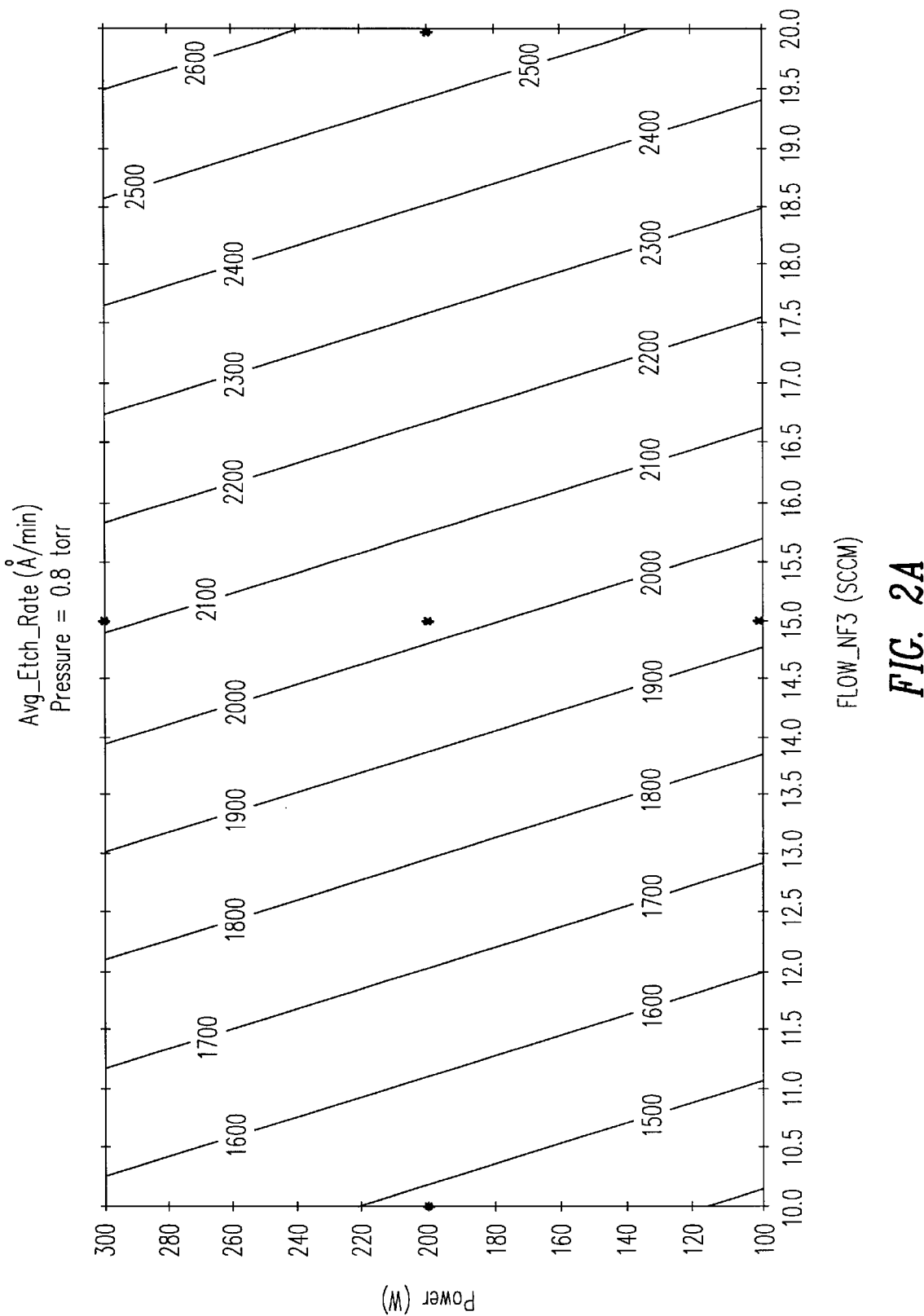
FIGS. 2A–2C are graphs of average etch rates associated with this invention as functions of power, flow rate, and pressure.
Figure 2B:
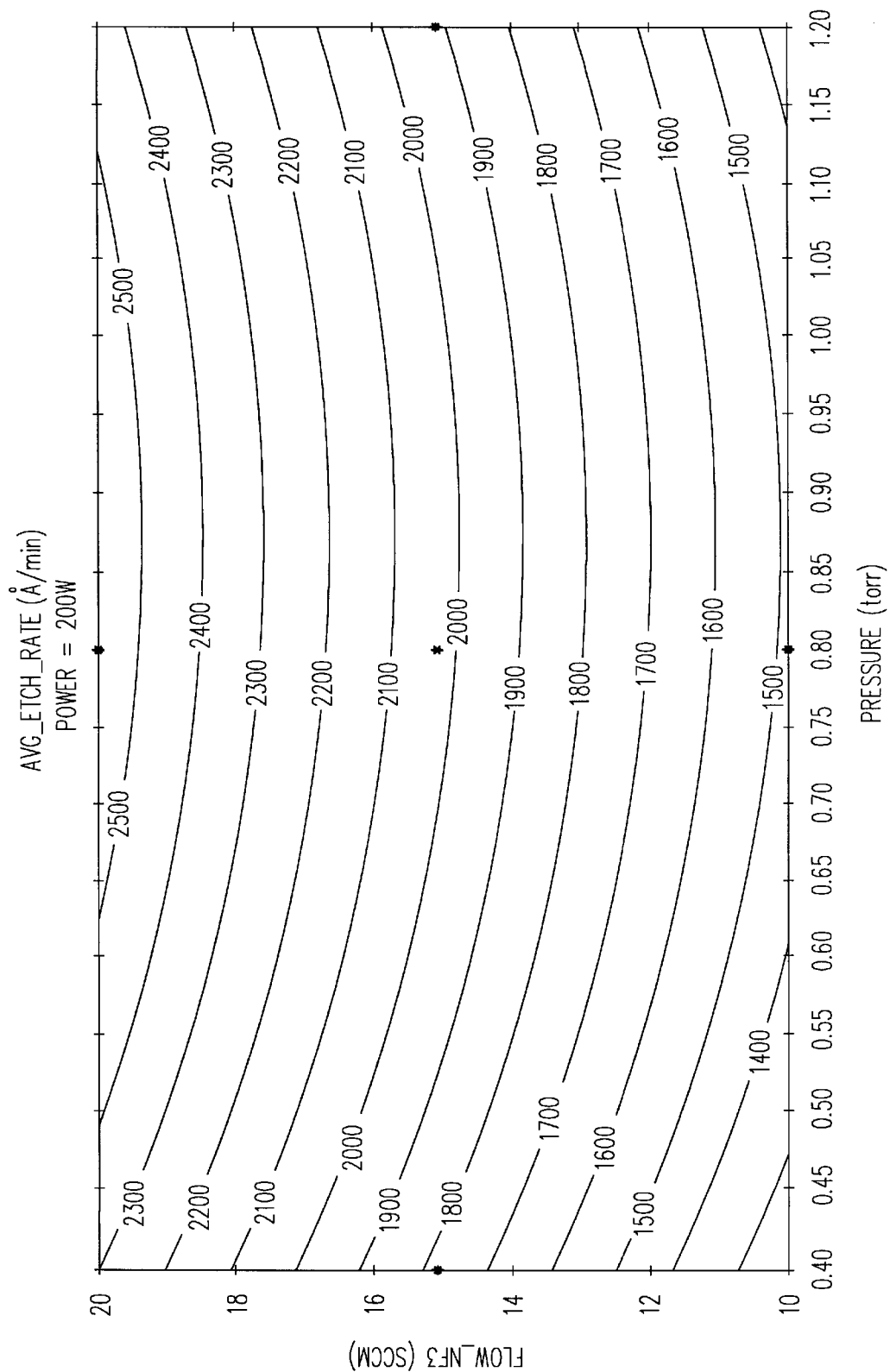
Figure 2C:
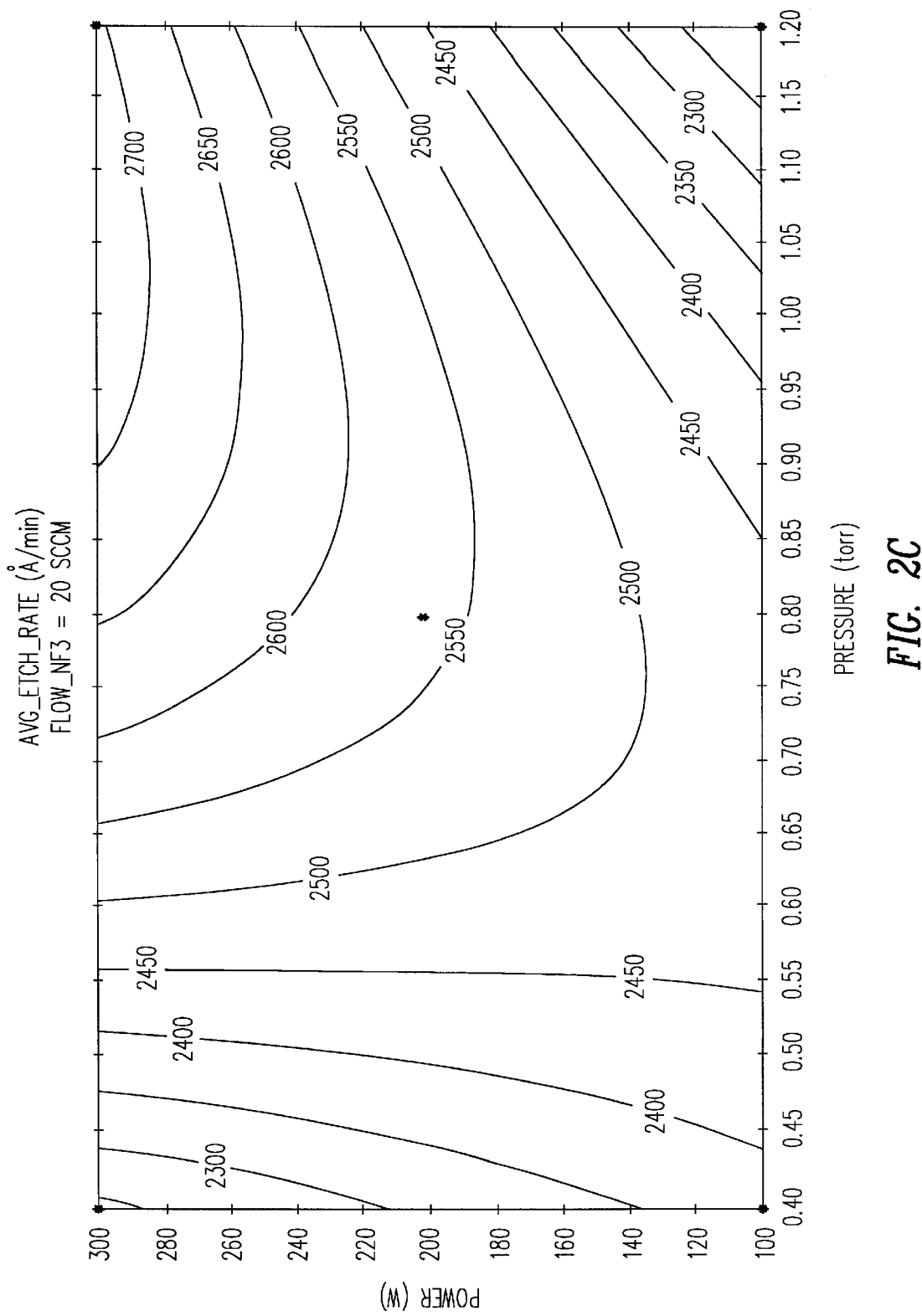

FIGS. 2A–2C illustrate the relationship of average etch rates to pressure, power, and flow rate. The average etch rate (AER) is obtained by measuring the etch rate at four equidistant points located 10 mm in from the edge of a six-inch wafer and at one point at the center of the wafer. These five measurements are then averaged to get the average etch rate in Å/min. FIG. 2A shows the AER as a function of power and flow rate at a fixed pressure of 0.8 torr, FIG. 2B shows the AER as a function of pressure and flow at a fixed power of 200 W, and FIG. 2C shows the AER as a function of power and pressure at a fixed flow rate of 20 sccm.

Figure 3A:
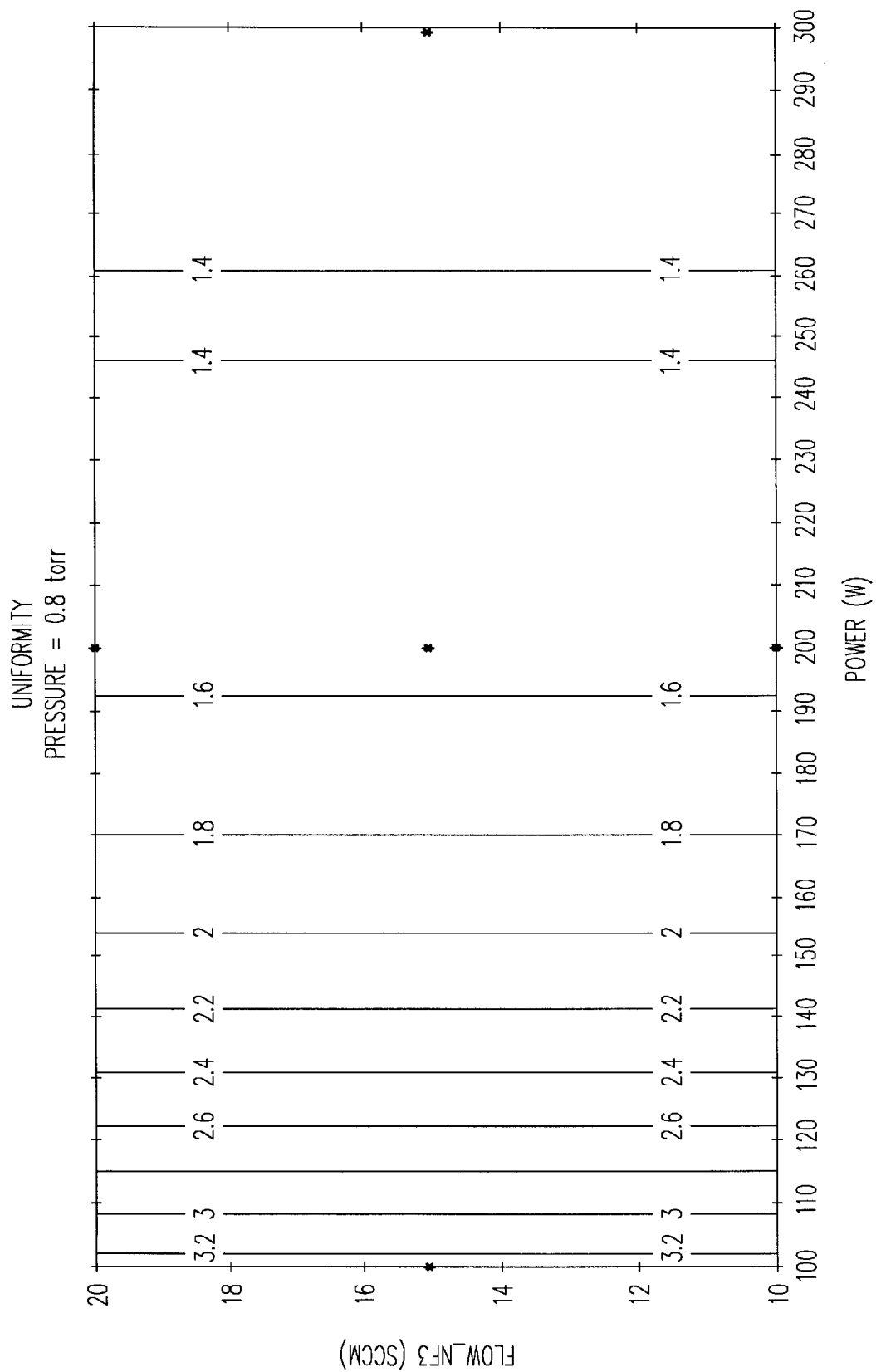
FIGS. 3A–3C are graphs of etch rate uniformities associated with this invention as functions of power, flow rate, and pressure.
Figure 3B:
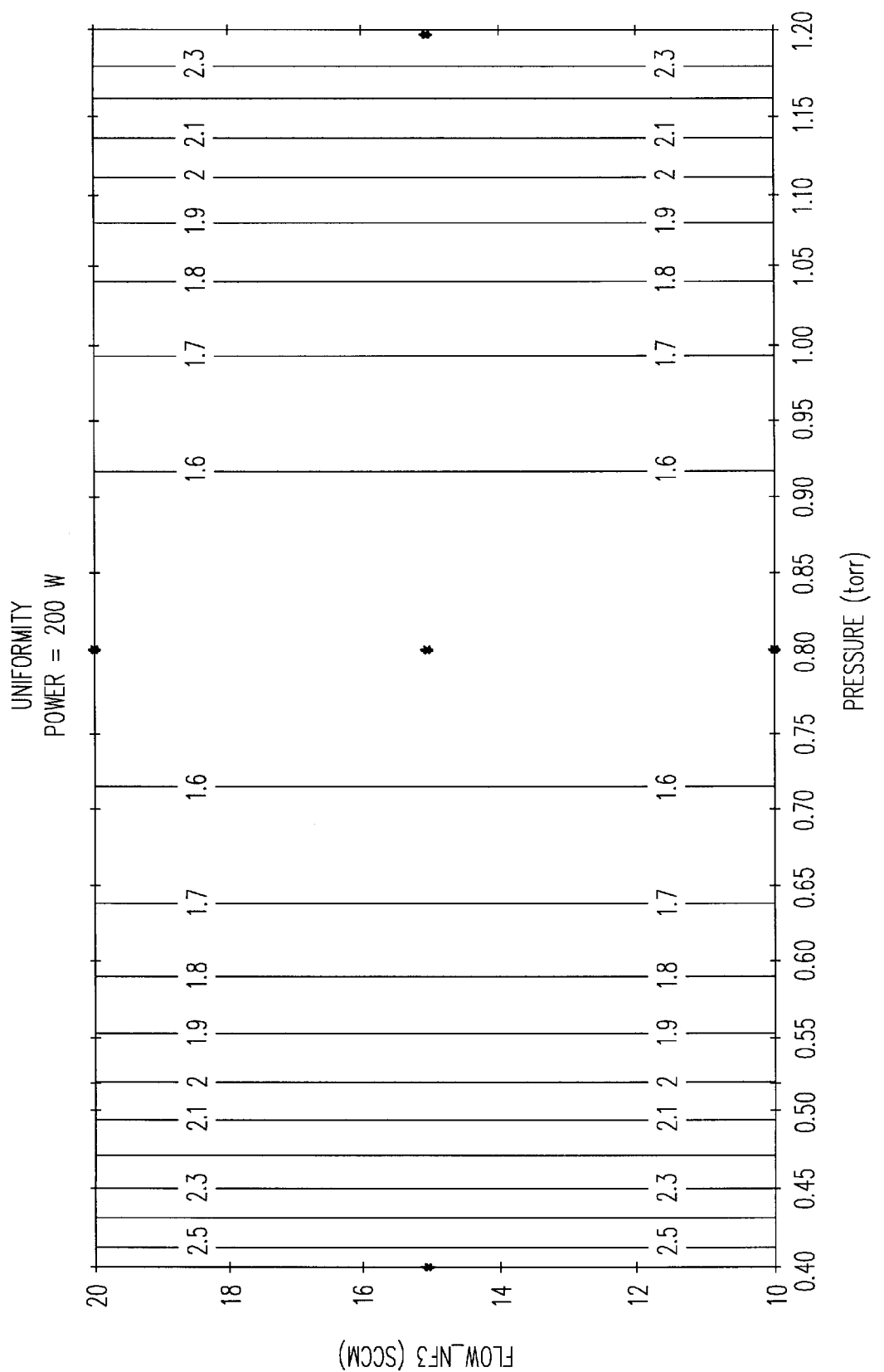
Figure 3C:
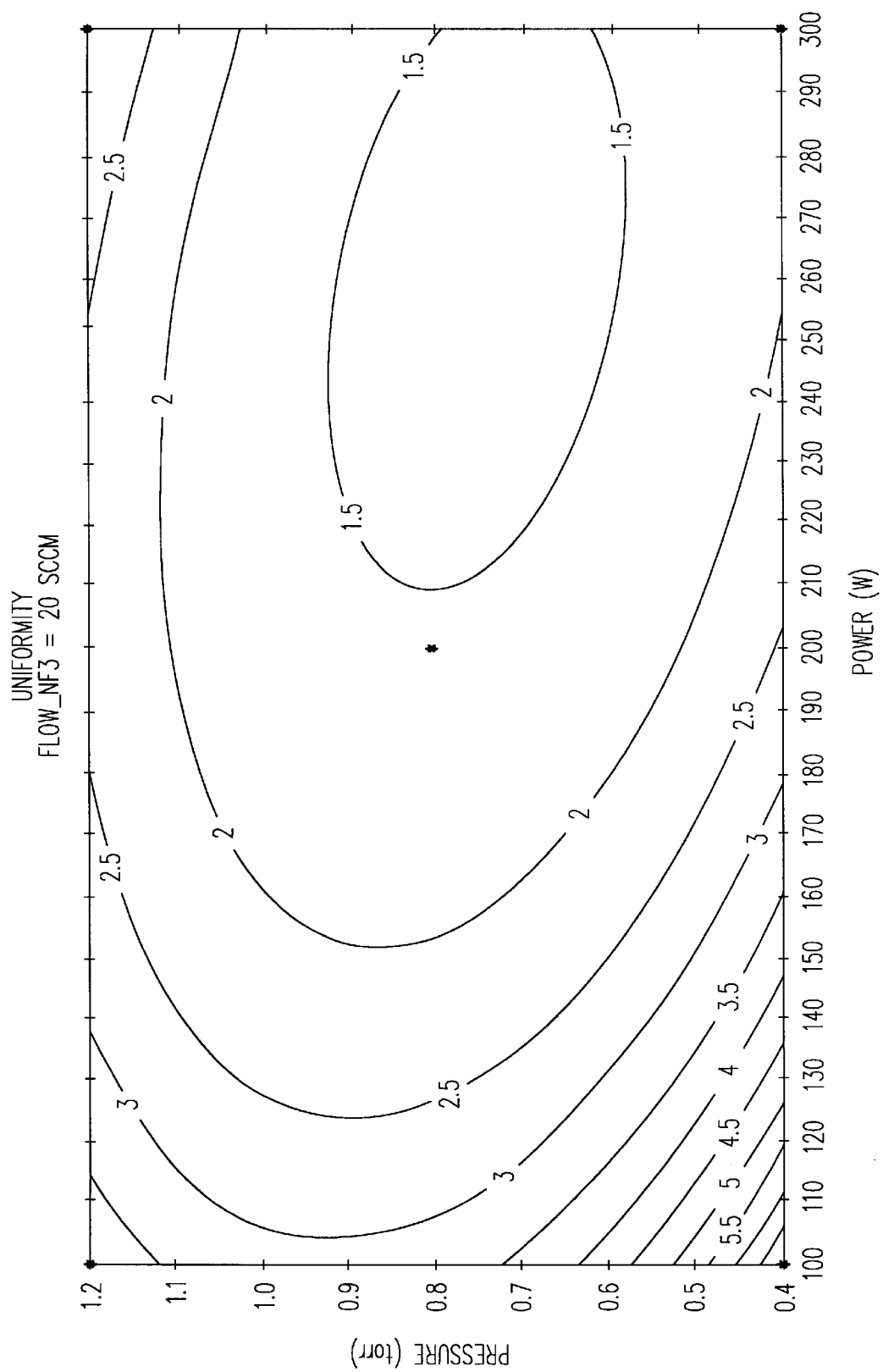

FIGS. 3A–3C illustrate the uniformity of the etch rate as functions of power, pressure, and flow rate. The uniformity is defined as:

$$\frac{ER_{max} - ER_{min}}{ER_{max} + ER_{min}} * 100\%.$$

$ER_{max}$ is the maximum etch rate and $ER_{min}$ is the minimum etch rate of the five measured etch rates. FIG. 3A shows the uniformity as a function of flow rate and power at a fixed pressure of 0.8 torr, FIG. 3B shows the uniformity as a function of flow rate and pressure at a fixed power of 200 W, and FIG. 3C shows the uniformity as a function of pressure and power at a fixed flow rate of 20 sccm.

The values for FIGS. 2A–2C and FIGS. 3A–3C were generated with the wafer at room temperature. However, if higher etch rates or smoother surfaces are desired, the pre-clean chamber and wafer temperature may be raised accordingly. Even if the temperature is increased, the cleaning process of the present invention operates at temperatures substantially below temperatures of epitaxial deposition or prior cleaning methods.

Figure 4:
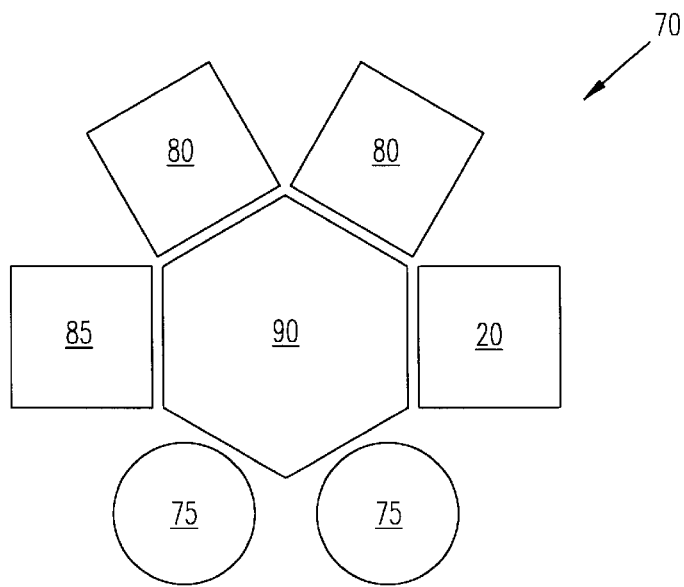
FIG. 4 is a diagram of an epitaxial processing system using the cleaning system of FIG. 1.

FIG. 4 is a simplified top view of an epitaxial deposition system 70 using one pre-clean chamber 20, two load locks 75, two epitaxial deposition chambers 80, a cooling chamber 85 and a transfer chamber 90. Wafers to be processed are first loaded into load locks 75. After oxygen is removed from load locks 75, a wafer is transferred from one of load locks 75 to pre-clean chamber 20 via transfer chamber 90, which contains a clean, oxygen-free environment. The wafer is then cleaned of native oxide and contaminated silicon in pre-clean chamber 20, as described above, and transferred to one of epitaxial deposition chambers 80. After an epitaxial layer is deposited, the wafer, which is at approximately 800–900° C., is then transferred to cooling chamber 85. Finally, the wafer is moved back to one of load locks 75 and then removed.

During epitaxial deposition of one wafer, another wafer may be inserted into pre-clean chamber 20 to be cleaned in preparation for processing in an unused deposition chamber 80. Because of the short time needed to clean a wafer as compared to epitaxial deposition, a single pre-clean chamber 20 can be configured to feed multiple deposition chambers 80. The use of a separate cleaning chamber allows the deposition chamber to be dedicated solely to the epitaxial deposition process so that cleaning and epitaxial growth processes can be performed in parallel on separate wafers. As a result, throughput is increased. Furthermore, because pre-clean chambers are much less expensive than deposition chambers, system cost efficiency is increased. Typically, a pre-clean chamber can cost 1/10 that of a deposition chamber, due in part to less complex heating, cooling, gas flow and monitoring requirements for the pre-clean chamber.

Therefore, using $NF_3$ gas to etch and clean silicon wafers at reduced temperatures in a separate pre-clean chamber improves throughput and system cost efficiency, while reducing slip, autodoping, and other high temperature problems.

While particular embodiments of the present invention have been shown and described, it will be obvious to those skilled in the art that various changes and modifications may be made without departing from this invention in its broader aspects. Therefore, the appended claims encompass all such changes and modifications as fall within the true spirit and scope of this invention.

We claim:

1. A method for cleaning a silicon surface comprising:
   inserting a wafer into a pre-clean chamber, wherein said pre-clean chamber is separate from a deposition chamber; and
   introducing a nitrogen trifluoride gas mixture into said pre-clean chamber, wherein said wafer in said pre-clean chamber is at a temperature lower than a temperature for epitaxial deposition.

2. The method of claim 1 wherein said nitrogen trifluoride gas mixture comprises a diluent at a flow rate in the range of approximately 20–200 sccm and nitrogen trifluoride at a flow rate in the range of approximately 2–30 sccm.

3. The method of claim 2 wherein said diluent is selected from the group consisting of argon, nitrogen and helium.

4. The method of claim 1 wherein said nitrogen trifluoride gas mixture is at a pressure in the range of approximately 0.1 to 10 torr.

5. The method of claim 1 wherein said nitrogen trifluoride gas mixture is subjected to an RF power in the range of approximately 100–500 watts.

6. The method of claim 1 wherein said temperature of said wafer is at approximately room temperature.

7. A system for cleaning a silicon surface comprising a pre-clean chamber, wherein said pre-clean chamber is separate from a deposition chamber, and wherein said pre-clean chamber comprises means for introducing fluorine atoms into said pre-clean chamber for cleaning a wafer at a temperature lower than for epitaxial deposition.

8. The method of claim 1, further comprising generating a plasma with said nitrogen trifluoride gas mixture by a plasma generator outside of said pre-clean chamber prior to said introducing.

9. The method of claim 1, further comprising heating nitrogen trifluoride gas by a heating source outside of said pre-claim chamber prior to said introducing.

10. The system of claim 7, further comprising a means for generating said fluorine atoms, wherein said means for generating are located outside said pre-clean chamber.

11. The system of claim 10, wherein said means for generating is a plasma generator.

12. The system of claim 10, wherein said means for generating is a heating source.

13. The system of claim 7, wherein said temperature is approximately room temperature.

* * * * *